United States Patent
Shieh et al.

(10) Patent No.: US 6,696,308 B1
(45) Date of Patent: Feb. 24, 2004

(54) ELECTRICALLY PUMPED LONG-WAVELENGTH VCSEL WITH AIR GAP DBR AND METHODS OF FABRICATION

(76) Inventors: Chan-Long Shieh, 6739 E. Bar Z La., Paradise Valley, AZ (US) 85253; Jeff Tsao, 12513 Crested Moss Rd., Albuquerque, NM (US) 87122

( * ) Notice: Subject to any disclaimer, the term of this patent is extended or adjusted under 35 U.S.C. 154(b) by 126 days.

(21) Appl. No.: 09/699,112

(22) Filed: Oct. 27, 2000

(51) Int. Cl.[7] .............................................. H01L 21/00
(52) U.S. Cl. ........................ 438/24; 438/46; 438/483; 438/42
(58) Field of Search ............................. 438/22, 24, 29, 438/28, 34, 40, 41, 42, 43, 44, 46, 47

(56) References Cited

U.S. PATENT DOCUMENTS

| | | | | |
|---|---|---|---|---|
| 4,991,179 A | * | 2/1991 | Deppe et al. ................ | 372/45 |
| 5,835,521 A | * | 11/1998 | Ramdani et al. .............. | 372/96 |
| 5,985,686 A | * | 11/1999 | Jayaraman ................... | 438/32 |
| 5,991,326 A | * | 11/1999 | Yuen et al. ................... | 372/96 |
| 6,306,672 B1 | * | 10/2001 | Kim ............................. | 438/22 |
| 6,438,149 B1 | * | 8/2002 | Tayebati et al. .............. | 372/45 |
| 2002/0025590 A1 | * | 2/2002 | Hall et al. .................... | 438/29 |
| 2002/0054618 A1 | * | 5/2002 | Jiang et al. ................... | 372/43 |

* cited by examiner

Primary Examiner—Savitri Mulpuri
(74) Attorney, Agent, or Firm—Parsons & Goltry; Robert A. Parsons; Michael W. Goltry

(57) ABSTRACT

A method of fabricating an electrically pumped, long-wavelength vertical cavity surface emitting laser includes epitaxially growing a stack of alternate layers of a first material and a second material on a compatible substrate. A long wave-length active region is epitaxially grown on the stack and a lasing aperture and current confinement volume are defined in the long wave-length active region. A first mirror stack is formed on the long wave-length active region and portions of one of the first material and the second material are removed to form a high reflectivity second mirror stack.

7 Claims, 5 Drawing Sheets

ELECTRICALLY PUMPED LONG-WAVELENGTH VCSEL WITH AIR GAP DBR AND METHODS OF FABRICATION

FIELD OF THE INVENTION

This invention relates to vertical cavity surface emitting lasers capable of emitting long-wavelength light and particularly to improved mirror stacks in electrically pumped, long-wavelength vertical cavity surface emitting lasers and to methods of fabrication.

BACKGROUND OF THE INVENTION

Vertical cavity surface emitting lasers (VCSELs) include first and second distributed Bragg reflectors (DBRs) formed on opposite sides of an active area. The VCSEL can be driven or pumped electrically by forcing current through the active area or optically by supplying light of a desired frequency to the active area. Typically, DBRs or mirror stacks are formed of a material system generally consisting of two materials having different indices of refraction and being easily lattice matched to the other portions of the VCSEL. In conventional VCSELs, conventional material systems perform adequately.

However, new products are being developed requiring VCSELs which emit light having long-wavelengths. VCSELs emitting light having long-wavelengths are of great interest in the optical telecommunications industry. This long-wavelength light can be generated by using a VCSEL having an InP based active region. When an InP based active region is used, however, the DBRs or mirror stacks lattice matched to the supporting substrate and the active region do not provide enough reflectivity for the VCSELs to operate because of the insignificant difference in the refractive indices between the two DBR constituents.

Dielectric mirror stacks can be used for VCSEL applications, but they suffer from poor thermal conductivity. Since the performance of these long-wavelength materials is very sensitive to temperature, the thermal conductivity of the DBRs is very important. At least one of the DBRs must have good thermal conductivity to dissipate the heat generated by the laser.

A metamorphically grown DBR has good thermal conductivity and can be used as a heat conducting DBR, as described in copending United States of America Patent Application entitled "Method of Fabricating Long-Wavelength VCSEL and Apparatus", filed on Aug. 21, 2000, Ser. No. 09/642,359, and incorporated herein by reference. To provide a practical fabrication process, the top DBR can be grown metamorphically, using the substrate (wafer) for support. However, formation of a second or lower DBR with sufficient reflectivity requires the removal of some or all of the substrate. This removal process can be long and difficult.

Accordingly it is highly desirable to provide electrically pumped long-wavelength VCSELs with good thermal conductivity and methods of fabrication.

It is an object of the present invention to provide new and improved methods of fabricating electrically pumped long-wavelength vertical cavity-surface emitting lasers.

It is another object of the present invention to provide new and improved methods of fabricating electrically pumped long-wavelength vertical cavity surface emitting lasers in which both DBRs are grown using semiconductor procedures.

It is still another object of the present invention to provide new and improved methods of fabricating electrically pumped long-wavelength vertical cavity surface emitting lasers in which a lower epitaxially grown DBR is provided with improved reflectivity.

It is still another object of the present invention to provide new and improved electrically pumped long-wavelength vertical cavity surface emitting lasers.

It is a further object of the present invention to provide new and improved electrically pumped long-wavelength vertical cavity surface emitting lasers incorporating DBRs with materials having good thermal conductivity and refractive indices.

SUMMARY OF THE INVENTION

The above objects and others are realized in a method of fabricating an electrically pumped, long-wavelength vertical cavity surface emitting laser including epitaxially growing a stack of alternate layers of a first material and a second material on a compatible substrate. A long wave-length active region is epitaxially grown on the stack and a lasing aperture and current confinement volume are defined in the long wave-length active region. A first mirror stack is formed on the long wave-length active region and portions of one of the first material and the second material are removed to form a high reflectivity second mirror stack.

The above objects and others are further realized in an electrically pumped, long-wavelength vertical cavity surface emitting laser in which a stack of alternate layers of a first epitaxially grown material and a second epitaxially grown material are positioned on a compatible substrate. An epitaxially grown long wave-length active region is positioned on the stack and a lasing aperture and current confinement volume are positioned in the long wave-length active region. A first mirror stack is positioned on the long wave-length active region and portions of one of the first material and the second material are removed to form a high reflectivity mirror stack.

BRIEF DESCRIPTION OF THE DRAWINGS

Referring to the drawings.

DESCRIPTION OF THE PREFERRED EMBODIMENT

Figure 1:
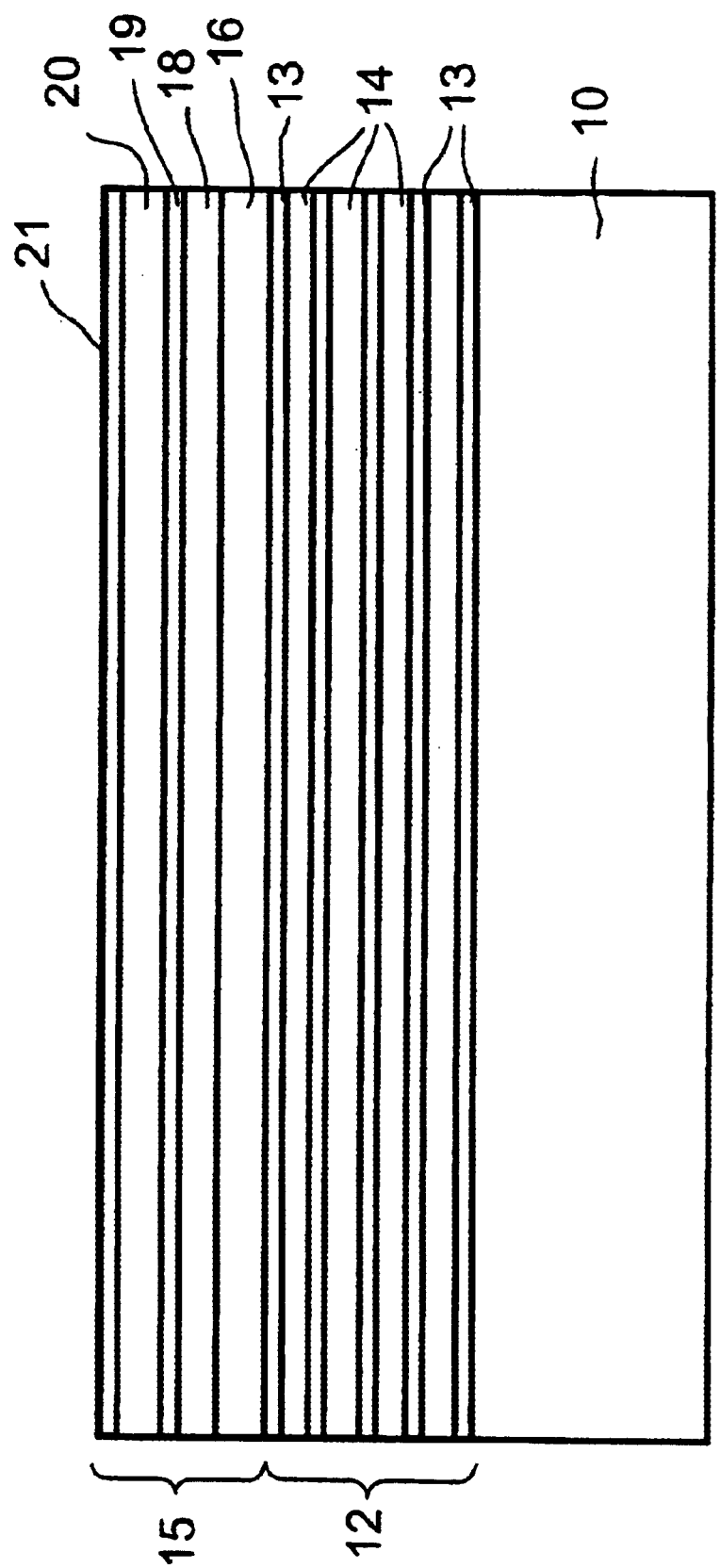
FIGS. 1 through 5 are simplified sectional views illustrating sequential steps in a method of fabricating VCSELs in accordance with the present invention.

Turning now to FIGS. 1 through 5, various steps are illustrated, sequentially, in a method of fabricating electrically pumped, vertical cavity surface emitting lasers (VCSELS) in accordance with the present invention. Referring specifically to FIG. 1, a substrate 10 is provided which may be, for example a semiconductor wafer or the like. A stack 12 of alternate layers 13 and 14 of material is epitaxially grown on the surface of substrate 10. For ease in later processing, alternate layers 13 and 14 are selected to have a large differential etching capability. In a preferred embodiment layers 13 include InGaAsP and layers 14 include InP. Thus, layers 13 and 14 can be epitaxially grown and lattice matched to substrate 10, which in the preferred embodiment is an InP based wafer.

A long-wavelength active region 15 is formed on the upper surface of stack 12 and in this specific embodiment includes one or more layers of cladding 16, an active area 18 including multiple layers defining one or more quantum wells with interspersed barrier layers, a layer of transformable material 19, one or more layers of cladding 20, and a contact layer 21. It will of course be understood that contact layer 21 is included in active region 15 in this discussion only because the entire structure is generally epitaxially grown in a single operation and the inclusion or exclusion does not limit the invention in any way. It will also be understood that layers 13, 14, 16, 18, 19, 20, and 21 are generally deposited or grown in blanket layers over an entire wafer so that a large number of VCSELs are fabricated simultaneously.

Contact layer 21 includes electrically conductive material, which forms a part of an upper electrical contact, as will be explained in more detail presently. Generally, active area 18 includes one or more quantum well layers with barrier layers therebetween and cladding and/or spacer layers 16 and 20 define the upper and lower surfaces. As is understood by those skilled in the art, active region 15 is formed with a thickness of approximately one half of a wavelength to multiple of one half of a wavelengths of the emitted light. Cladding layers 16 and 20 are included to provide carrier confinement and phase matching and to this end they generally have higher bandgaps than active area 18. Here it should be understood that, while cladding layers 16 and 20 are illustrated and referred to as single layers, either or both can include multiple layers in various embodiments and for varying purposes.

Figure 2:
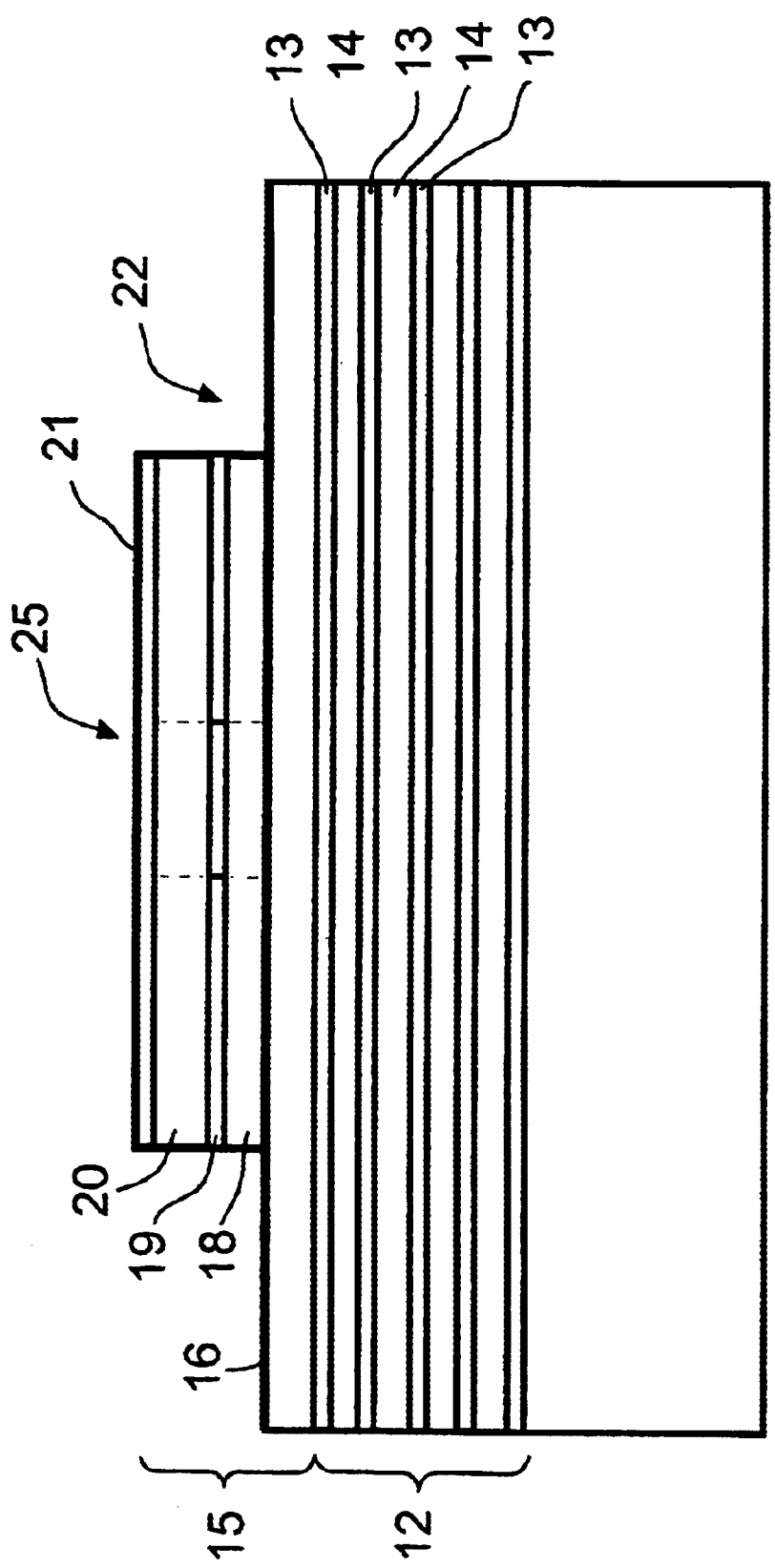

Layer 19 of transformable material is included for use in forming an electrically conductive portion defining a lasing aperture and current confinement volume, with the electrically conductive portion being limited by an electrically insulating portion. Referring additionally to FIG. 2, a mesa 22 is formed by etching through a portion of active region 15 (in this embodiment, contact layer 21, cladding layer 20, layer 19, and active area 18) to expose the edge of layer 19 and to separate active region 15 into individual VCSELs. It will be understood that if a single layer 19 is included, or if additional layers of transformable material are included, the etching will proceed at least until the edges of the one or all of the layers of transformable material are exposed. Also, it should be understood that mesa 22, and the following structure, is generally circular in shape and illustrates a single VCSEL of the many VCSELs generally fabricated simultaneously on wafer 10.

Layer 19 is formed of any material that can be transformed from an electrical conductor to an electrical insulator, such as an easily oxidizable semiconductor material, an easily etched material, etc. Also, it is preferable that the material of layer 19 can be grown epitaxially with stack 12 and the remaining portions of active region 15. In the preferred embodiment, layer 19 is formed of InAlAs with a relatively heavy amount of aluminum. With the edges exposed, the aluminum in layer 19 is oxidized by any convenient means, such as by introducing it into steam or other oxidizing agents. The aluminum in layer 19 oxidizes much faster than aluminum in any of the other layers of active region 15 (if aluminum is present in any of the other layers) because of the amount of aluminum in layer 19.

As illustrated in FIG. 2, layer 19 is oxidized uniformly around mesa 22 to define a lasing aperture and current confinement volume 25 (indicated by broken lines) Because layer 19 is oxidized outside of volume 25 current is not conducted therethrough and current flowing between contact layer 21 and stack 12 is limited or confined to volume 25. Also, because current is confined to volume 25, lasing is confined to volume 25 so that the conductive portion of layer 19 defines the lasing aperture.

Figure 3:
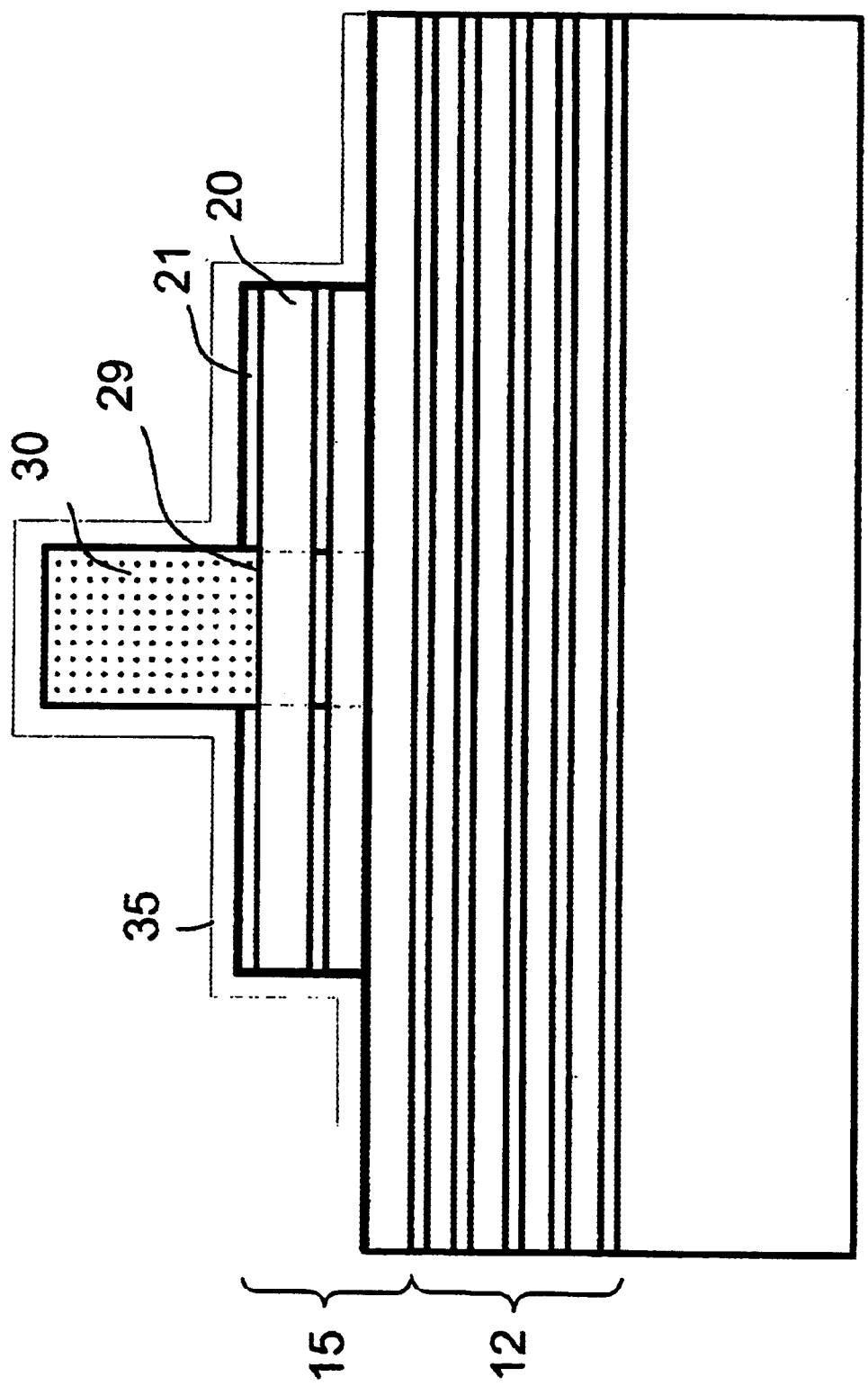

Referring additionally to FIG. 3, a window 29 is formed, by etching or the like, in contact layer 21 so as to expose the upper surface of cladding layer 20. A distributed Bragg reflector (DBR) mirror stack 30 is positioned on the exposed upper surface of cladding layer 20 of active region 15 in window 29. As known in the art, it is common to epitaxially grow alternate layers of, for example, InGaAsP and InAlGaAs on an InP based active region. The major problem with this type of DBR is that the refractive index difference is too small to provide good reflectivity. To provide a mirror stack with a good reflectivity, mirror stack 30 is either metamorphically grown or a dielectric mirror stacks is used. While a dielectric mirror stack is relatively easy to deposit, they suffer from poor thermal conductivity. It has been found that materials with good thermal conductivity and refractive indices can be metamorphically grown on long-wavelength active region 15.

Here it should be understood that "metamorphic growth" is a type of epitaxial growth (e.g. by LPCVD, MOCVD, PECVD, CVD, sputtering, etc.,) in which the crystal lattice of the grown material does not strictly match the lattice of the substrate. By metamorphically growing the grown material, the lattice of the grown material gradually changes from similar to the lattice of the substrate to the relaxed lattice of the grown material. In this fashion, DBR materials with good thermal conductivity and large differences in the index of refraction can be conveniently grown on a long-wavelength active region. Some examples of pairs of material with good thermal conductivity and index of refraction which can be metamorphically grown on a long-wavelength active region are: layers of $Al_xGa_{1-x}As/Al_yGa_{1-y}As$, where x is in a range of from approximately 0.5 to 1 and y is in a range of from approximately 0 to 0.5; micro-crystalline silicon and micro-crystalline silicon carbide; and micro-crystalline silicon and micro-crystalline aluminum oxide.

During the formation of DBR mirror stack 30, in some procedures deposition may occur over the entire structure (i.e., contact layer 21, as well as cladding layer 20 in window 29). In these procedures, portions of the deposited layers overlying contact layer 21 are removed by etching or the like to form the metamorphically grown layers into columns or mirror stacks 30 and to expose contact layer 21 for further process steps. In processes where the deposited layers are etched into columns, contact layer 21 can be conveniently used as an etch-stop layer.

With DBR mirror stack 30 completed as described, a passivation layer 35 is deposited over the structure. As is understood in the art, passivation layer 35 is utilized primarily to prevent further oxidation of active region 11. Also, in this embodiment, passivation layer 35 protects DBR mirror stack 30 during further processing steps.

Figure 4:
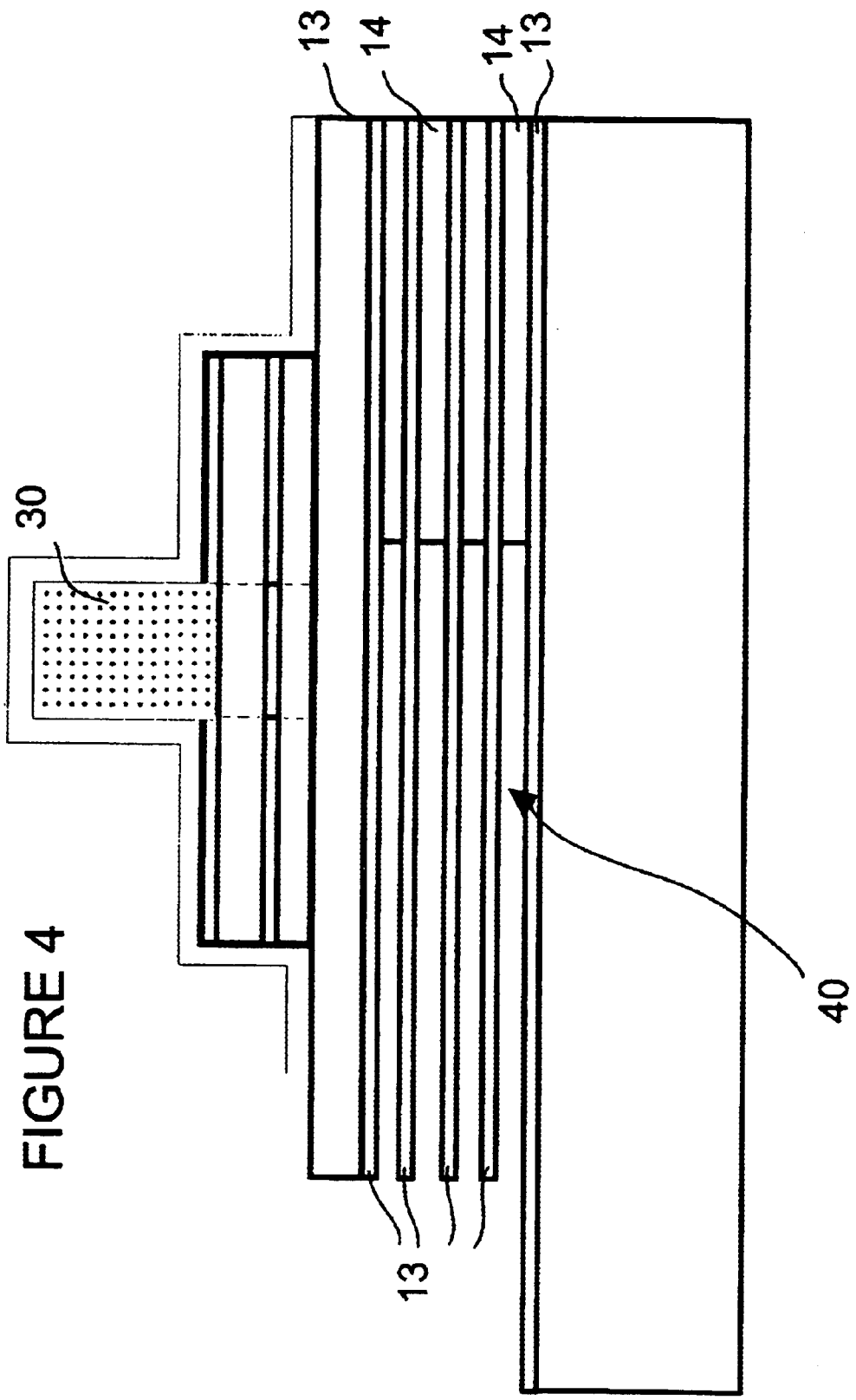

After the upper portion of the VCSEL is completed as described, portions of one of layers 13 or 14 are removed, as illustrated in FIG. 4. As described above, layers 13 and 14 are selected to have a large differential etching capability so that removal can be performed readily by selectively undercutting the layers in alignment with lasing aperture and current confinement volume 25. In a preferred embodiment, layers 13 include InGaAsP and layers 14 include InP. The InP layers can be selectively etched with little or no damage to the InGaAsP layers, or vice versa. As a result, a mirror stack 40 is produced in alignment with lasing aperture and current confinement volume 25 which includes alternate layers of InGaAsP and air (or space) The alternate layers of InGaAsP and air provide a very high discontinuity and only a few pairs are required to achieve a sufficiently high reflectivity. Also, the remaining portions of layers 13 and 14 provide good thermal conductivity from the VCSEL and good electrical contact to the lower side of active region 15.

A Via 42 is opened through passivation layer 35 to expose the upper surface of contact layer 21 surrounding DBR mirror stack 30. Second level metallization is performed to deposit contact metal 45 in an ohmic contact with the exposed surface of contact layer 21. Contact metal 45 serves as the upper electrical contact for the VCSEL. In this embodiment, the remaining portions of layers 13 and 14 will provide good conduction of heat away from the VCSEL. However, if additional heat conduction is desired, any passivation material that may have been deposited on DBR mirror stack 30 can be removed to expose the side and top surfaces. Contact metal 40 can then be deposited in communication with the sides and a portion of the upper surface of DBR mirror stack 30. The contact with DBR mirror stack 30 will enhance heat conduction from the VCSEL, especially if the mirror stack is metamorphically grown.

Figure 5:
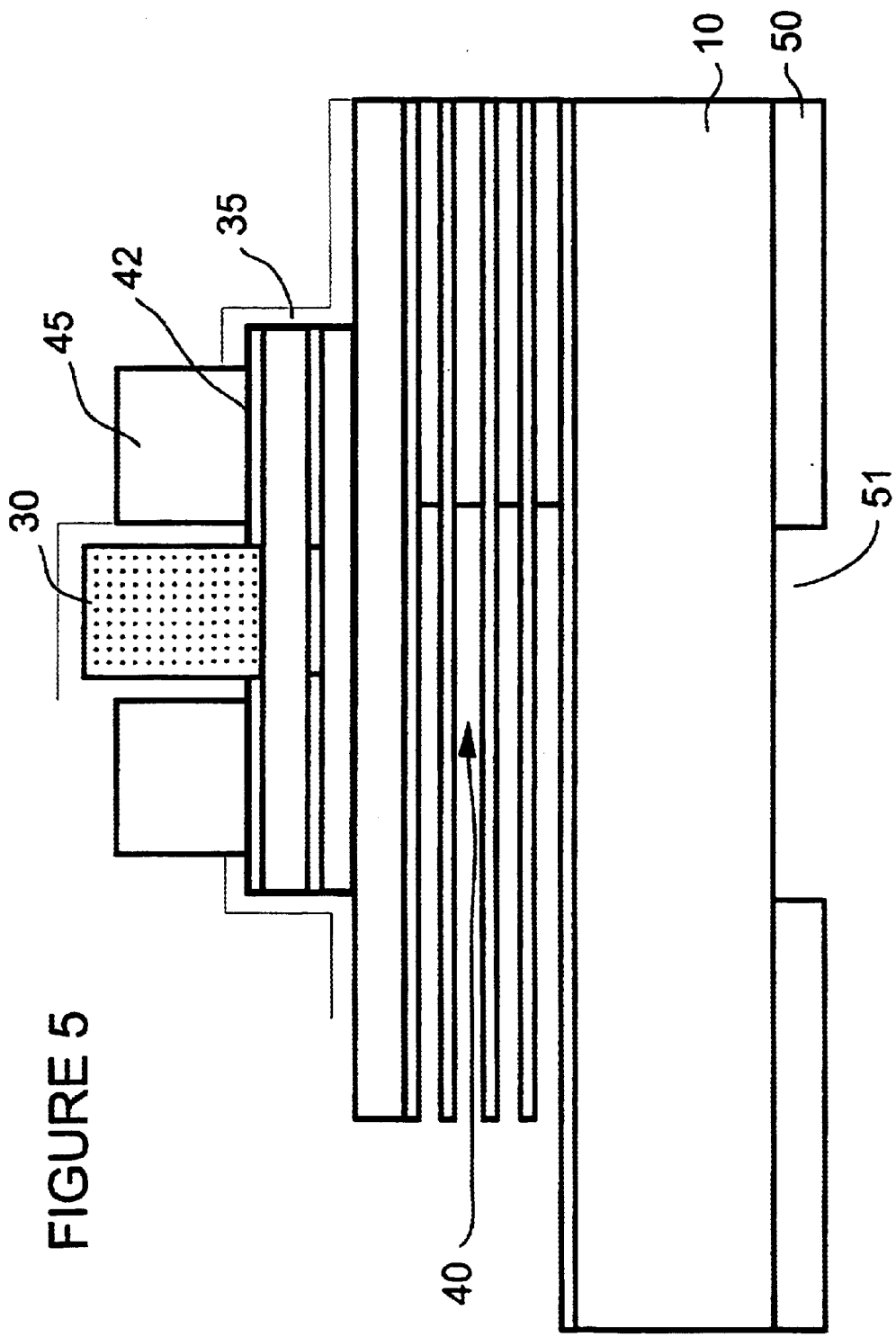

Contact metal 50 is deposited on the lower surface of substrate 10, as illustrated in FIG. 5, to provide a lower electrical contact for the VCSEL. An opening 51 is provided in contact metal 50 to allow emission of light from the VCSEL. It will of course be understood that by simply removing passivation layer 35 from the upper end of mirror stack 30 and adjusting mirror stacks 30 and 40, light emission could be provided through mirror stack 30.

In a specific example of the above described VCSEL, substrate 10 is an InP based semiconductor wafer and long-wavelength active region 15 is InP based material grown epitaxially on substrate 10. Contact layer 21 includes InGaAs. Long-wavelength active area 18 includes, for example, several quantum well layers of either InGaAsP or InGaAlAs with wider bandgap InGaAsP or InGaAlAs or InP barrier layers therebetween. Cladding layers 16 and 20 include either InGaAsP or InGaAlAs sufficiently thick to provide carrier confinement and phase matching and generally have a higher bandgap than active area 18. Mirror stack 30 includes metamorphically grown layers of $Al_xGa_{1-x}As/Al_yGa_{1-y}As$, where x is in a range of from approximately 0.5 to 1 and y is in a range of from approximately 0 to 0.5. As is understood by those skilled in the art, DBR mirror stack 30 includes a sufficient number of mirror pairs (e.g., 20 to 40) so as to provide a high reflectivity for light generated by active region 15. Layers 13 and 14 include epitaxially grown InGaAsP and InP, respectively, and four or five layers provide sufficient reflectivity. As described above, layer 19 of transformable material preferably includes InAlAs, AlAsSb, or any other semiconductor materials with relatively heavy amounts of aluminum and near lattice matched to InP.

While the steps of the fabrication methods have been described, and will be claimed, in a specific order, it will be clear to those skilled in the art that various steps and procedures may be performed in a different order. It is intended, therefore, that the specific order described or claimed for the various fabrication steps does not in any way limit the invention and any variations in order that still come within the scope of the invention are intended to be covered in the claims.

Thus, a new and improved electrically pumped, long-wavelength VCSEL has been disclosed incorporating materials with good thermal conductivity and refractive indices. Further, new and improved methods of fabricating electrically pumped, long-wavelength VCSELs are disclosed utilizing materials with good thermal conductivity and refractive indices. The new and improved electrically pumped, long-wavelength VCSEL can be fabricated with metamorphically grown or dielectric mirror stacks on one side while the other mirror stack is epitaxially grown for simplicity in fabrication. The epitaxially grown mirror stack provides good electrical contact and, through removal of portions of the epitaxially grown layers, provides good reflectivity. Electrical contact is made through a contact layer on one side of the active region and through the epitaxially grown layers so that the high series resistance of the metamorphically grown or dielectric mirror stacks is not included. Further, current confinement is accomplished through one or more intermediate layers including an electrically conductive portion defining a lasing aperture and current confinement volume and an electrically insulating portion limiting the current confinement volume. Also, the VCSEL embodiment illustrated and disclosed can be fabricated to emit light from either side (e.g. mirror stack 30 or mirror stack 40 of FIG. 5).

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating an electrically pumped, long-wavelength vertical cavity surface emitting laser comprising the steps of:

epitaxially growing an indium phosphide based stack of alternate layers of a first material and a second material, including epitaxially growing alternate layers of InP and one of InGaAsP and InAlGaAs, on a compatible indium phosphide based substrate;

epitaxially growing a long wave-length indium phosphide based active region on the stack wherein the long wave-length active region substantially emits light at a wavelength in a range from approximately 1.2 microns to 2 microns;

defining a lasing aperture and current confinement volume in the long wave-length active region;

forming a first mirror stack by metamorphically growing a distributed Bragg reflector on the long wave-length active region in alignment with the lasing aperture and current confinement volume; and removing by etching portions of one of the first material and the second material in the lasing aperture to form a mirror stack with a high reflectivity portion and retaining the one of the first material and the second material adjacent to and partially surrounding the lasing aperture and in thermal contact with the active region to provide a high thermal conductivity portion for dissipating a substantial amount of heat from the long wave-length active region, by selectively undercutting the InP layers in alignment with the lasing aperture and current confinement volume.

2. A method of fabricating an electrically pumped long-wavelength vertical cavity surface emitting laser as claimed in claim 1 wherein the step of metamorphically growing a distributed Bragg reflector includes one of growing alternate layers of micro-crystalline silicon and micro-crystalline silicon carbide, growing alternate layers of micro-crystalline silicon and micro-crystalline aluminum oxide, and growing alternate layers of $Al_xGa_{1-x}As$ and $Al_yGa_{1-y}As$, where x is in a range of from approximately 0.5 to 1 and y is in a range of from approximately 0 to 0.5.

3. A method of fabricating an electrically pumped, long-wavelength vertical cavity surface emitting laser as claimed in claim 1 wherein the step of epitaxially growing the stack of alternate layers of the first material and the second material include epitaxially growing alternate layers of material with a large differential etching capability.

4. A method of fabricating an electrically pumped, long-wavelength vertical cavity surface emitting laser as claimed in claim 1 further including a step of depositing an electrical contact on the long wave-length active region prior to the step of forming the first mirror stack on the long wave-length active region.

5. A method of fabricating an electrically pumped, long-wavelength vertical cavity surface emitting laser as claimed in claim 4 further including a step of forming a window in the electrical contact in alignment with the lasing aperture and forming the first mirror stack in the window.

6. A method of fabricating an electrically pumped, long-wavelength vertical cavity surface emitting laser as claimed in claim 1 wherein the step of defining the lasing aperture and current confinement volume includes forming at least one layer of transformable material in the long wave-length active region having an electrically conductive portion defining the lasing aperture and current confinement volume, the electrically conductive portion being limited by an electrically insulating portion.

7. A method of fabricating an electrically pumped, long-wavelength vertical cavity surface emitting laser as claimed in claim 6 wherein the step of forming at least one layer of material in the long wave-length active region having the electrically conductive portion includes depositing a layer of semiconductor material containing aluminum and oxidizing a portion of the aluminum containing semiconductor material to form the electrically insulating portion.

* * * * *